(12) United States Patent
Tang et al.

(10) Patent No.: US 7,191,428 B2
(45) Date of Patent: Mar. 13, 2007

(54) CENTERLINE-BASED PINCH/BRIDGE DETECTION

(75) Inventors: ZongWu Tang, Pleasanton, CA (US); Juhwan Kim, Pleasanton, CA (US); Daniel Zhang, San Jose, CA (US); Haiqing Wei, San Jose, CA (US); Gang Huang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1 day.

(21) Appl. No.: 11/142,789

(22) Filed: May 31, 2005

(65) Prior Publication Data

US 2006/0271906 A1 Nov. 30, 2006

(51) Int. Cl.
*G06F 17/50* (2006.01)

(52) U.S. Cl. .......................... 716/19; 716/21

(58) Field of Classification Search ................ 716/19, 716/21, 18; 430/5, 22, 30
See application file for complete search history.

(56) References Cited

U.S. PATENT DOCUMENTS

| | | | |
|---|---|---|---|
| 6,453,457 B1* | 9/2002 | Pierrat et al. ................. | 716/19 |
| 6,625,801 B1* | 9/2003 | Pierrat et al. ................. | 716/19 |
| 6,883,158 B1* | 4/2005 | Sandstrom et al. ........... | 716/19 |
| 7,010,775 B2* | 3/2006 | Ohmori ......................... | 716/19 |
| 2005/0177811 A1* | 8/2005 | Kotani et al. .................. | 716/21 |

* cited by examiner

*Primary Examiner*—Jack Chiang
*Assistant Examiner*—Binh Tat
(74) *Attorney, Agent, or Firm*—Bever, Hoffman & Harms, LLP; Jeanette S. Harms

(57) ABSTRACT

A method for performing layout verification involves identifying feature centerlines in a mask layout, and then performing lithography simulation along the centerlines to generate a set of intensity distributions. At each local maxima or minima in the intensity distributions, further lithography simulation can be performed to determine an exposure pattern width at those local maxima/minima (check positions). The exposure pattern widths can then be evaluated to determine whether an actual pinch or bridge defect will be generated at those locations. If defect generation is likely (based on the lithographical simulation) at a particular location, the corresponding portion of the mask layout can be redesigned to avoid defect generation during actual production. In this method, accurate layout verification can be performed with a minimum of time-consuming lithography modeling.

17 Claims, 6 Drawing Sheets

MASK LAYOUT 320

SIMULATED EXPOSURE PATTERN 340

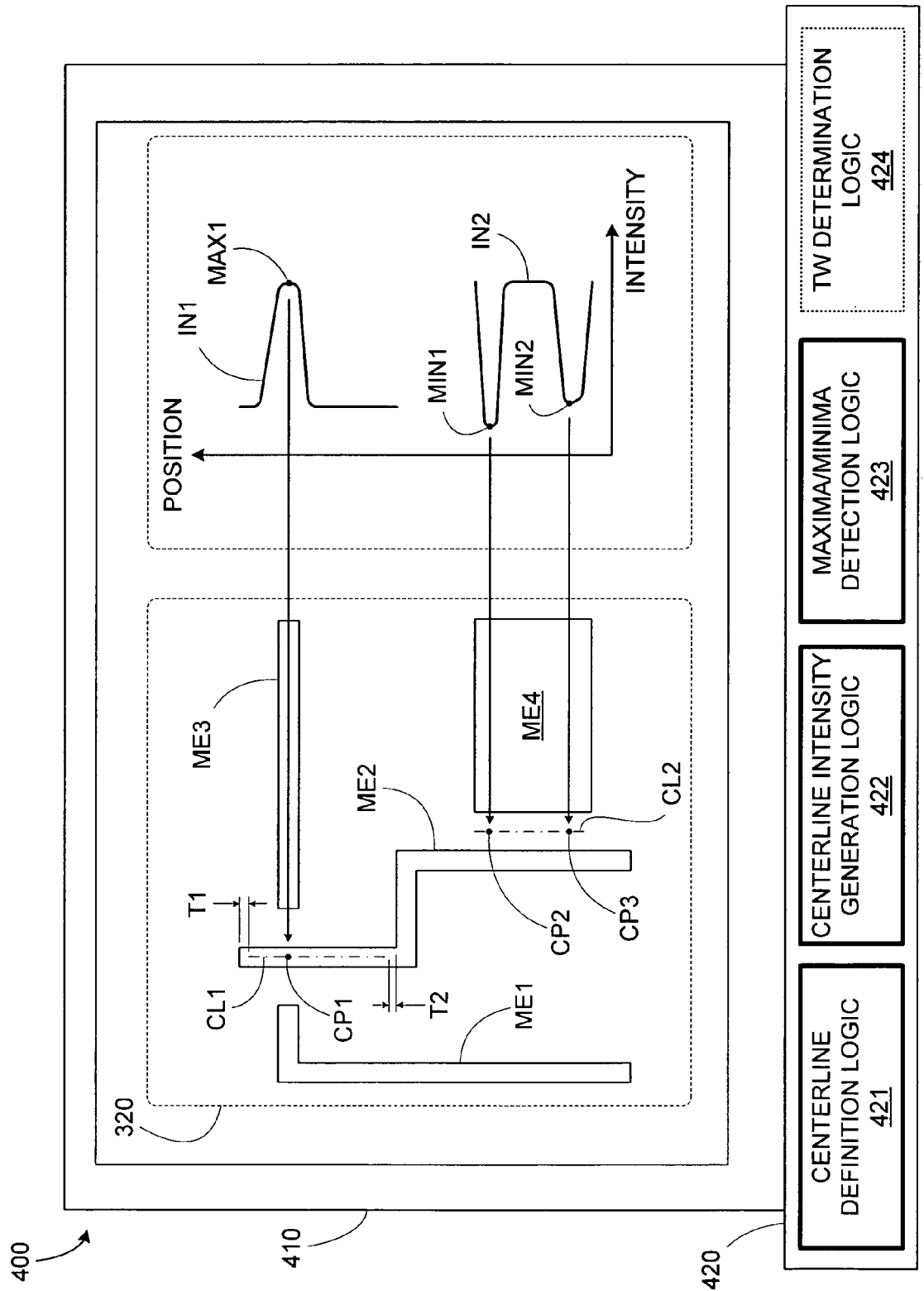

CENTERLINE-BASED PINCH/BRIDGE DETECTION

BACKGROUND OF THE INVENTION

1. Field of the Invention

The invention relates to the field of integrated circuit design, and in particular, to a system and method for efficiently and accurately detecting patterns in a circuit layout that are likely to generate pinch and bridge conditions during lithography.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer). The models define performance parameters for the cells; e.g., parameters related to the operational behavior of the cells, such as power consumption, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112–E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and Designware® products.

During logic design and functional verification (step E114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During layout verification (step E126), various checking functions are performed to ensure correctness for: manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

After resolution enhancement (step E128), another layout verification operation (step E129) is performed to ensure that the geometric manipulations performed during step E128 have not introduced any unintended problems (e.g., mask manufacturing rule violations and layout patterns that could cause lithographic defects). An exemplary EDA software product from Synopsys, Inc. that can be used at this step is the SiVL product.

Finally, during mask data preparation (step E130), the "tape-out" data for production of masks for lithographic use to produce finished chips is performed. Mask data preparation is sometimes referred to as "mask synthesis". Exemplary EDA software products from Synopsys, Inc. that can be used at this step include the CATS(R) family of products.

Note that once mask production (and chip manufacturing) begins, any changes to the design layout become very expensive. Therefore, layout verification (i.e., steps E126 and/or E129) is a critical gateway in the overall design flow, since problems that are not identified during verification will typically not be detected until manufacturing defects in actual processed wafers are discovered. This results in both mask and wafer wastage, and hence, large cost and schedule penalties.

FIG. 2 shows a simplified view of a lithography operation in which a mask 210 that includes a mask pattern 220 is used to expose an exposure pattern 240 onto a wafer 230. Radiation emitted from an exposure source 290 partially blocked by opaque (lightly shaded) regions of mask pattern 220 and partially transmitted by transparent (unshaded) regions of mask pattern 220, thereby allowing mask pattern 220 to be projected onto wafer 230 to generate exposure pattern 240.

Note that exposure pattern 240 will generally not match mask pattern 220 due to various optical effects (e.g., diffraction) that occur during the exposure process. This distortion of exposure pattern 240 relative to mask pattern 220 is increased as the sizes of the elements in mask pattern 220 are reduced and the complexity of the mask pattern 220 is increased.

Two of the most common and most problematic defects that arise from this type of distortion are "pinch" defects and "bridge" defects. A pinch defect is an excessive narrowing of an element in an exposure pattern, such as indicated by pinch defect 241. This narrowing can undesirably affect device performance (e.g., by increasing line resistance). Meanwhile, a bridge defect is an excessive diminishment of a gap between adjacent elements, such as indicated by bridge defect 242. Pinch and bridge defects can lead to diminished or inconsistent device performance (e.g., by increasing resistance (pinch) or creating shorts (bridge)) and reduced output yield.

Thus, one of the key goals of layout verification (steps E126/E129 in FIG. 1) is to detect portions of the mask layout that are likely to generate pinch and bridge defects. Traditionally, this detection has been performed via physical verification of the layout. Physical verification involves performing a dimensional check of a layout to identify any elements or element groupings in that layout that exhibit dimensional characteristics that have been deemed problematic (i.e., likely to generate pinch/bridge defects if used in an actual lithography operation).

For example, FIG. 3A depicts a general set of layout dimensions that can be checked during physical verification. FIG. 3A shows a top view of a simplified mask layout 320 (in this case, the mask layout corresponding to mask pattern 220 in FIG. 2) that includes mask layout elements ME1, ME2, ME3, and ME4. A variety of spacings S1 through S5 between mask layout elements ME1–ME4 are depicted (for clarity, not all spacings are labeled). Note that two layout elements may exhibit a variety of spacings, depending on the shape(s) of those elements. For example, because layout element ME1 is L-shaped, layout elements ME1 and ME2 are separated by a first spacing S1 and a second spacing S2, due to the L-shape of layout element ME1.

In a conventional physical verification operation, spacings S1 through S5 would then be evaluated to identify any problematic locations. For example, the portion of layout element ME2 adjacent to the tips of layout elements ME1 and ME3 may generate a pinch defect in an exposure pattern (projected layout) produced using mask layout 320. Therefore, during physical verification, that portion of layout element ME2 may be flagged as a potentially problematic region if the values of spacings S2 and S3 are below a pinching threshold value. Meanwhile, the relatively long facing edges of layout elements ME2 and ME4 can generate bridging defects in the exposure pattern. Accordingly, during physical verification, the facing edges of layout elements ME2 and ME4 may be flagged if spacing S4 is less than a bridging threshold value. In this manner, physical verification can be used to identify potentially problematic portions of a mask layout.

Unfortunately, the verification of lithographic manufacturability in modern IC designs (layout elements having sub-100 nm dimensions) can be beyond the capabilities of conventional physical verification techniques. Two dimensionally identical element groupings in a mask layout may produce different projected images on a wafer due to process variations. Advanced resolution enhancement technologies (step E128 shown in FIG. 1) such as optical proximity correction (OPC) and assist features that enhance the printability of a layout design (i.e., the match between the mask layout and the projected layout) further reduce the applicability and effectiveness of physical verification.

Consequently, modern layout verification generally involves what is known as simulation-based verification (or lithography-based verification). In simulation-based verification, advanced models of the lithography processes for actual IC production are used to generate an expected exposure pattern for a mask layout. For example, FIG. 3B shows a simulated exposure pattern 340 that could be generated from mask layout 320 shown in FIG. 3A. Simulated exposure pattern 340 represents the pattern expected to be exposed onto a wafer by mask layout 320 using a particular lithography process (with simulated exposure pattern elements SE1 through SE4 corresponding to mask layout elements ME1 through ME4, respectively, in FIG. 3A). By evaluating simulated exposure pattern 340, pinch defects (such as in region P1) and bridge defects (such as in region B1) can be directly identified. The portions of the original mask layout (320) corresponding to the location of those (simulated) pinch and bridge defects can then be modified as appropriate to prevent the formation of such defects in production wafers.

In this manner, simulation-based verification provides a means for picking out problem areas of a mask layout. Unfortunately, performing the accurate lithographic simulation on the complex mask patterns required for modern IC designs is very computationally expensive. Therefore, simulation-based verification can add significantly to the cycle time of an EDA process. In many instances, the additional delays that are introduced can make simulation-based verification infeasible, despite the significant benefits provided in the detection of pinch and bridge defects.

Accordingly, it is desirable to provide a system and method for efficiently and accurately detecting regions susceptible to pinch and bridge defects in an IC design layout.

SUMMARY OF THE INVENTION

Modern IC designs have evolved beyond the capabilities of physical verification, and now generally require some sort of simulation-based verification to detect potential defect-inducing layout configurations. However, conventional simulation-based verification, which can provide accurate detection of portions of a mask layout likely to generate pinch/bridge defects, can also be too computationally expensive to perform efficient layout checking.

By applying a centerline intensity-based layout verification technique, even the most complex and dense IC layouts can be quickly and accurately evaluated for defect-inducing regions. Specifically, by performing lithography simulation only along selected centerlines and check positions of a mask layout, the defect detection benefits of simulation-based verification can be achieved at a much lower computational cost.

To perform centerline intensity-based layout verification, a set of feature centerlines is selected from a layout under consideration. The layout features for which the centerlines are selected can either be layout elements (i.e., polygons forming the layout pattern) or spaces between layout elements. In one embodiment, the set of feature centerlines can simply be all the feature centerlines from the layout. In another embodiment, the set of feature centerlines can include only the centerlines of features that are likely to generate defects during lithography (e.g., a long and narrow layout element that is closely surrounded by other layout elements or a space between layout elements with long facing edges). In another embodiment, the centerlines can be trimmed away from any line ends and/or corners in their associated layout features to reduce the chances of incorrect defect generation.

Exposure intensity distributions can then be generated for each of the set of feature centerlines by performing lithography simulation along those centerlines. Exposure intensity is generated by standard lithography modeling engines, but by only calculating exposure intensity along a set of layout centerlines, the modeling runtime is minimized. For each of these simulated exposure intensity distributions, local intensity maxima and minima are identified. The local intensity maxima/minima represent locations of exposure intensity extrema, and therefore indicate potential locations of pinch or bridge defects. In one embodiment, the layout positions corresponding to all such maxima/minima locations can be redesigned to correct defect-inducing regions of the layout.

In another embodiment, after the maxima/minima positions are determined, lithography simulation can be performed to determine a transverse width at each of those positions. The transverse width is defined as the width perpendicular to the centerline of the simulated exposure pattern feature associated with the intensity maximum/minimum position. The transverse width can then be evaluated to determine whether a pinch/bridge defect will actually be generated at that location. If so, then the corresponding location in the layout can be flagged for redesign. However, if the exposure pattern transverse width does not rise to the level of a defect, then no layout redesign is necessary. In this manner, the amount of redesign required in response to the layout verification process can be minimized.

In one embodiment, a computer-based system can include logic for performing the above-described centerline intensity-based layout verification. In another embodiment, computer instructions for performing the above-described centerline intensity-based layout verification can be encoded on a computer-readable medium, such as a hard drive, CD-ROM, or DVD-ROM.

The invention will be more fully understood in view of the following description and drawings.

BRIEF DESCRIPTION OF THE DRAWINGS

FIGS. 4A and 4B are diagrams of a centerline intensity-based layout verification system.

DETAILED DESCRIPTION

Modern IC designs have evolved beyond the capabilities of physical verification, and now generally require some sort of simulation-based verification to detect potential defect-inducing layout configurations. However, conventional simulation-based verification, which can provide accurate detection of portions of a mask layout likely to generate pinch/bridge defects, can also be too computationally expensive to perform efficient layout checking.

By applying a centerline intensity-based layout verification technique, even the most complex and dense IC layouts can be quickly and accurately evaluated for defect-inducing regions. Specifically, by performing lithography simulation only along selected centerlines and check positions of a mask layout, the defect detection benefits of simulation-based verification can be achieved at a much lower computational cost.

Figure 4B:
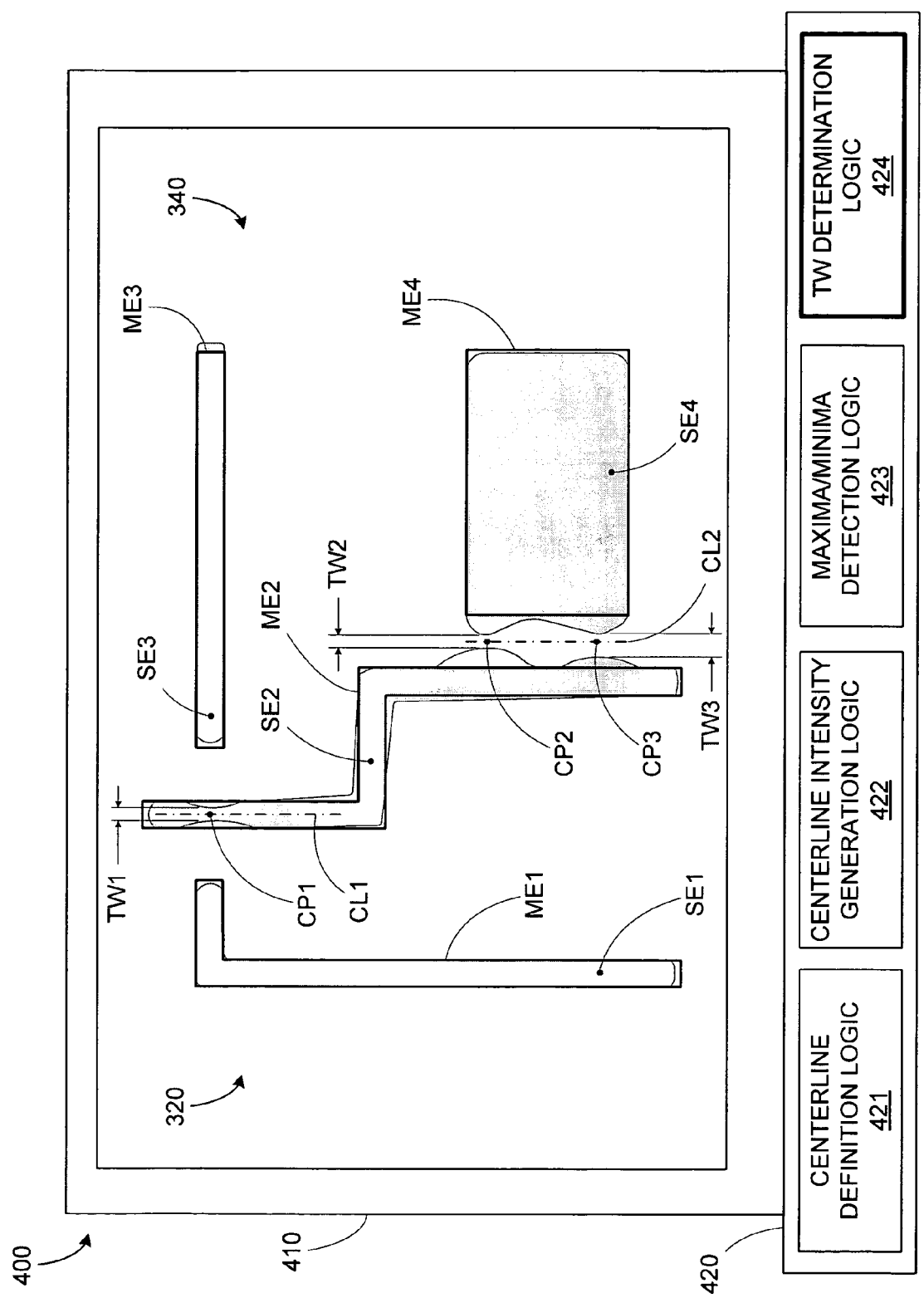

FIG. 4A shows an embodiment of a computer system 400 that can perform layout verification based on centerline intensity data. Computer system 400 includes a graphical display unit 410 (e.g., a computer monitor) and a processing unit 420 (e.g., a personal computer). Note that any graphical representations depicted on graphical display unit 410 in FIGS. 4A and 4B are purely for explanatory purposes, and that in various other embodiments, graphical display unit 410 can display any type or manner of graphical representation of the processes described with respect to FIGS. 4A and 4B. Note further that in another embodiment, graphical display unit 410 may be eliminated from the process entirely.

Processing unit 420 includes centerline definition logic 421, centerline intensity generation logic 422, maxima/minima detection logic 423, and optional transverse width (TW) determination logic 424. In one embodiment, logic 421–424 can comprise a software program (computer instructions) encoded on a computer-readable medium (e.g., hard drive, TW-ROM, or DVD-ROM). In various embodiments, the computer-readable medium can be incorporated into processing unit 420. In various other embodiments, the computer-readable medium can be external to processing unit 420 (e.g., processing unit 420 can be a "thin client" that runs the software from a networked server).

Figure 3A:
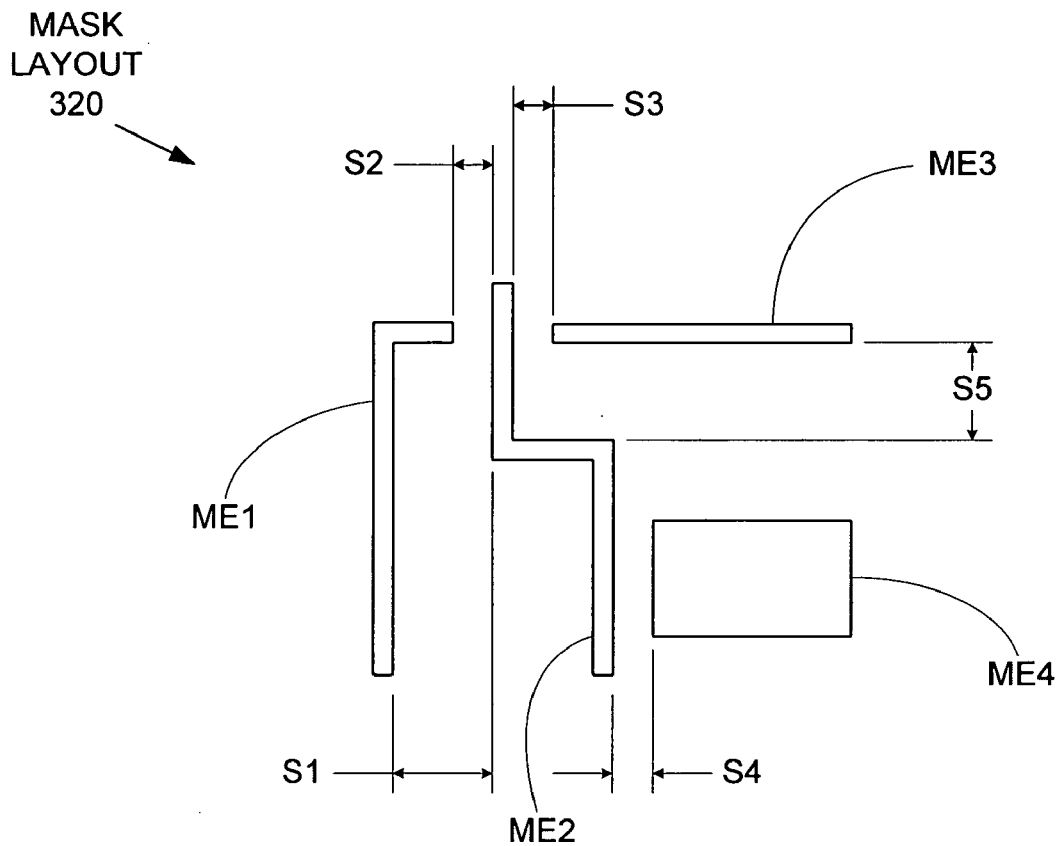
FIG. 3A is a diagram of a conventional physical verification operation.

To begin a verification operation, centerline definition logic 421 identifies the centerlines of mask layout features (i.e., mask layout elements and spaces between mask layout elements) and selects appropriate ones of those centerlines for subsequent evaluation. For example, graphical display unit 410 depicts a mask layout 320 (described above with respect to FIG. 3A) that includes mask layout elements ME1, ME2, ME3, and ME4. Centerline definition logic 421 can identify the centerline(s) of the features in mask layout 320—i.e., the centerlines of each of layout elements ME1–ME4 (i.e., "element centerlines") and the centerlines of the spaces between adjacent layout elements (i.e., "space centerlines").

In one embodiment, centerline definition logic 421 can pass all feature centerlines to centerline intensity generation logic 422 to continue the layout verification process. However, in another embodiment, centerline definition logic 421 can apply filtering rules to the set of all feature centerlines to eliminate from subsequent processing those feature centerlines that are unlikely to be associated with lithography defects. For example, since pinch defects are unlikely to be caused by mask layout elements that are wider than a certain threshold width (e.g., layout element ME4), centerline definition logic 421 could incorporate a filtering rule to ignore the centerlines for such layout elements (or portions of layout elements). Similarly, since a relatively large distance between adjacent mask layout elements (e.g., between layout elements ME3 and ME4) generally means that there will be little chance of bridge defect generation, centerline definition logic 421 could incorporate another filtering rule to ignore centerlines for spacing features greater than a threshold distance. Another filtering rule could be to ignore centerlines from layout elements that are widely spaced from any adjacent layout elements (e.g., layout element ME1). Yet another filtering rule could be to ignore centerlines for spacings between adjacent layout elements that have relatively short facing edge length (e.g., between layout elements ME2 and ME3)—this rule can be restated as ignoring centerlines for spacings having a relatively short length. Various other filtering rules will be readily apparent.

In another embodiment, the centerlines detected by centerline definition logic 421 can be modified to minimize the risk of false defect detection due to line shortening and corner rounding. Line shortening and corner rounding are common lithographic effects. Line shortening occurs when a relatively long and narrow mask element (a "line element") is projected onto a wafer and the exposure pattern element corresponding to the line element exhibits shortened line ends. Likewise, when mask layout elements having sharp corners are projected onto a wafer, the corners of the resulting exposure pattern elements typically exhibit some degree of rounding. Depending on the severity of the line shortening and/or corner rounding, such effects can lead to false positives in subsequent defect detection analysis (e.g., the shortened end of an exposure element may be misinterpreted as a pinch defect).

Therefore, in one embodiment, centerline definition logic 421 can trim a centerline such as centerline CL1 away from the end of any line element (e.g., by a distance T1) and/or from any corner (e.g., by a distance T2). Distances T1 (for line end trimming) and T2 (for corner trimming) would typically be determined based on the model data for the lithography process in which mask layout 320 is to be used, since different lithography processes will generally exhibit different degrees of line shortening and corner rounding. In one embodiment, distances T1 and T2 could be constant trim values for a particular layout design. In another embodiment, trim distances T1 and T2 could be specific to the particular centerline being trimmed (i.e., different centerlines will be trimmed by different amounts, depending on the particular layout details and process characteristics). Note that trimming can be applied to centerlines for both element centerlines and space centerlines.

Thus, as shown in FIG. 4A, after centerline filtering and/or trimming, centerline definition logic 421 might provide only centerlines CL1 and CL2 to centerline intensity generation logic 422. Centerline intensity generation logic 422 can then perform lithography simulation over centerlines CL1 and CL2 to generate centerline intensity distributions IN1 and IN2 (intensity vs. position). The lithography simulation performed by centerline intensity generation logic 422 is substantially similar to that performed by conventional simulation-based verification tools, except that centerline intensity generation logic 422 only calculates intensity in the portions of the exposure pattern that correspond to the centerlines selected by centerline definition logic 421. Therefore, centerline intensity generation logic can generate centerline intensity distributions IN1 and IN2 very quickly.

As noted above, lithography simulations generally involve generating a model exposure pattern that is expected to be produced by the mask layout during a lithography operation. The simulated exposure pattern is determined from the mask layout and on model data for a particular process (model data is typically provided by the fab that will be performing the actual lithography operation). The exposure pattern represents the pattern of light (exposure radiation) transmitted by a mask patterned with the mask layout onto a wafer. Due to optical effects (mainly refraction) as the light passes through the mask layout, the light incident on the wafer will exhibit intensity variations, as indicated by the varying profiles of centerline intensity distributions IN1 and IN2.

Maxima/minima detection logic 423 therefore can evaluate intensity distribution IN1 and IN2 to detect local maxima (e.g., point MAX1 in distribution IN1) and/or local minima (e.g., points MIN1 and MIN2 in distribution IN2). A local maximum in the intensity distribution represents a location on the wafer receiving "greater exposure" than its surroundings, while a local minimum represents a location receiving less exposure than its surroundings. Therefore, the local maxima and minima in the intensity graphs indicate potential pinch/bridge defects in the exposure pattern.

For example, if mask layout 320 is incorporated into a bright field mask, the intensity of the exposure pattern along centerline CL1 of layout element ME2 would be expected to be a relatively constant low value, since layout element ME2 would be expected to block most of the exposure radiation from reaching the wafer. However, local maximum MAX1 in intensity distribution IN1 indicates that (within the exposure pattern) check position CP1 along centerline CL1 is receiving more light than its neighboring points along centerline CL1. Therefore, check position CP1 represents a potential defect generation location in mask layout 320 (i.e., a location that may generate a (pinch) defect during actual lithography processes).

At the same time, the intensity of the exposure pattern along centerline CL2 between layout elements ME2 and ME4 would be expected to be a relatively constant high value, since the bright field between layout elements ME2 and ME4 would be expected to transmit most of the exposure radiation onto the wafer. However, local minima MIN1 and MIN2 in intensity distribution IN2 indicate that (within the exposure pattern) check positions CP2 and CP3 along centerline CL2 are receiving less light than their neighboring points along centerline CL2. Therefore, check positions CP2 and CP3 may also represent potential defect generation locations in mask layout 320 (i.e., locations that may generate bridge defects in the resulting exposure pattern).

Once the check positions (i.e., CP1, CP2, and CP3) in mask layout 320 are identified by maxima/minima detection logic 423, appropriate modifications can be made to mask layout 320 to minimize the chances of defect generation. However, it may be that not all of the check positions correspond to actual pinch or bridge defects (e.g., the pinching produced at location CP1 could be minimal enough to not cause any problems in the final IC). Therefore, to minimize unnecessary layout modification, processing unit 420 can include optional transverse width (TW) determination logic 424 for performing a more in-depth evaluation of the check positions detected by minima/maxima detection logic 423.

Figure 3B:
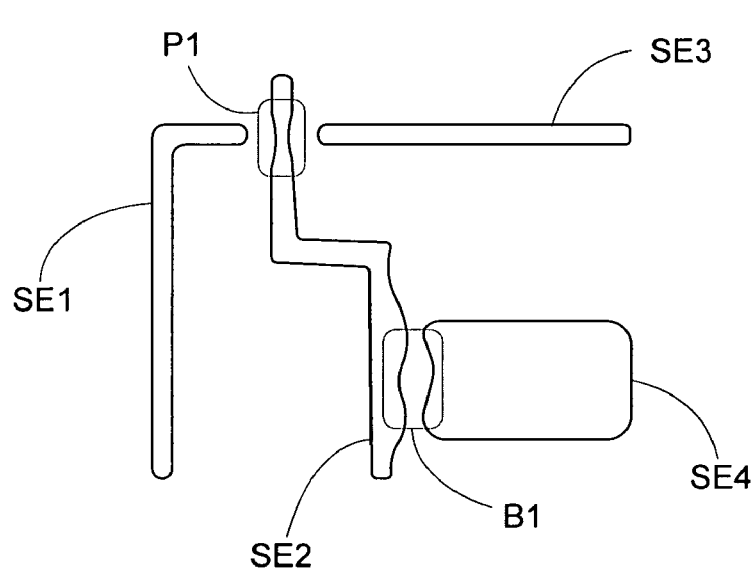
FIG. 3B is a diagram of a conventional simulation-based verification operation.

TW determination logic 424 performs localized lithography simulation at the check positions to provide a more detailed view of the actual lithographic behavior in those regions, thereby allowing a determination to be made as to whether defects will actually be generated at each check position. For example, FIG. 4B shows TW determination logic 424 in verification system 400 performing lithography simulation at check positions CP1, CP2, and CP3. For reference purposes, the entire simulation layout 340 (described with respect to FIG. 3B) is shaded and overlaid over mask layout 320 in FIG. 4B. However, TW determination logic 424 only models the portions of projected layout 340 that determine the transverse widths at check positions CP1, CP2, and CP3. Specifically, for each of check positions CP1 through CP3, TW determination logic 424 models the transverse width of the exposure pattern at that particular check position. The transverse width at a given check position is the width perpendicular to the centerline of the exposure pattern feature (i.e., exposure pattern element or space between exposure pattern elements) associated with that check position.

For example, TW determination logic 424 can perform a lithography simulation to calculate a transverse width TW1 for simulation layout element SE1 at check position CP1. If transverse width TW1 is less than a predetermined pinch threshold value, then a redesign of mask layout 320 in the region of check position CP1 can be performed to avoid generation of pinch defects during actual lithography processes. However, if transverse width TW1 is greater than the pinch threshold value, then no redesign of mask layout 320 is required, since the thinning of simulation element SE2 does not rise to the level of an actual pinch defect. Note that a single pinch threshold value can be used for pinch defect evaluation over an entire layout, or a variety of pinch threshold values can be defined so that different pinch threshold values can be used for different regions in a design (e.g., speed-critical lines may have larger pinch threshold values).

Similarly, TW determination logic 424 can perform lithography simulation to calculate transverse widths TW2 and TW3 at check positions CP2 and CP3, respectively, for the spacing between simulation elements SE2 and SE4. If transverse widths TW2 and/or TW3 are less than a predetermined bridge threshold value, then a redesign of mask layout 320 in the region(s) of check positions CP2 and/or CP3, respectively, can be performed to avoid generation of bridge defects during actual lithography processes. However, if transverse widths TW2 and TW3 are greater than the bridge threshold value, then no redesign of mask layout 320 is required, since the spacing reductions between simulation elements SE2 and SE4 do not rise to the level of actual bridge defects. Note that a single bridge threshold value can be used for bridge defect evaluation over an entire layout, or a variety of bridge threshold values can be defined so that different bridge threshold values can be used for different regions in a design.

Thus, by actually calculating the transverse widths at the check positions, an explicit determination can be made of whether or not a pinch or bridge defect is likely to be generated by those locations in the mask layout. By filtering out those check positions that will not actually cause pinch or bridge defects during actual lithography, the amount of subsequent layout redesign can be minimized. Note that because the lithography simulation used to determine the transverse widths is only performed at the check positions, the modeling calculations can be performed very quickly (as opposed to the lengthy computation times required by conventional "full mask" lithography modeling).

Figure 5:
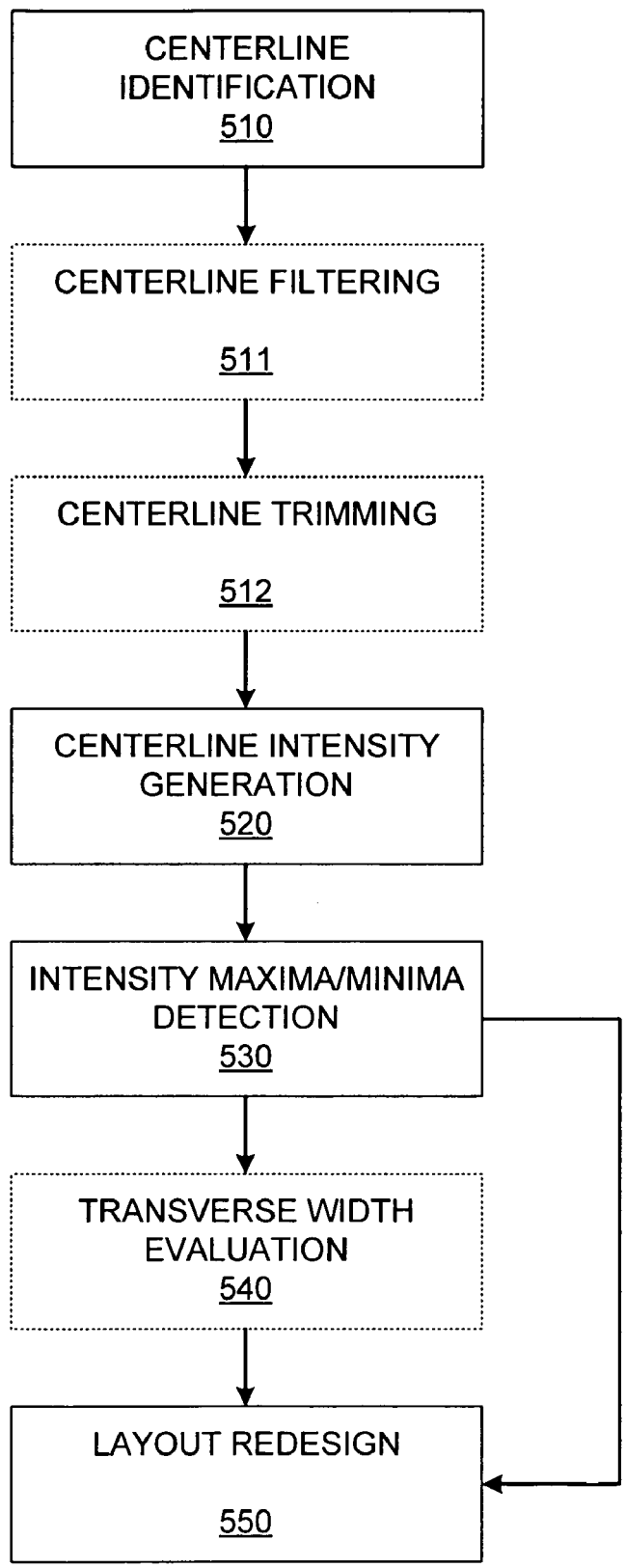
FIG. 5 is a flow diagram of a centerline intensity-based layout verification system.

FIG. 5 shows a flow diagram of the layout verification process described with respect to FIGS. 4A and 4B. In a "CENTERLINE IDENTIFICATION" step 510, the element and space centerlines in a layout are identified. In an optional (as indicated by the dotted line) "CENTERLINE FILTERING" step 511, the detected centerlines can be filtered to eliminate those centerlines that are unlikely to be associated with pinch or bridge defects. In an optional "CENTERLINE TRIMMING" step 512, the selected centerlines can be trimmed away from any edges and/or corners in the layout. Note that in one embodiment, step 510, and optionally steps 511 and/or 512, can be performed by centerline definition logic 421 in FIG. 4A.

Next, in a "CENTERLINE INTENSITY GENERATION" step 520, the expected exposure intensity distributions associated with the previously identified (and filtered/trimmed, if applicable) centerlines are calculated (e.g., by centerline intensity detection logic 422 in FIG. 4A). As noted above, any lithography simulation engine will be able to provide exposure intensity information, and since the intensity data is only required for simulation layout locations associated with element and space centerlines, the intensity data determination can be performed very rapidly using minimal computing resources.

Then, in an "INTESITY MAXIMA/MINIMA DETECTION" step 530, local maxima and/or minima in the previously determined centerline intensity distributions are identified (e.g., by maxima/minima detection logic 423 in FIG. 4A). Specifically, any peaks or valleys in the intensity distributions are located and evaluated, with each peak/valley defining a check position in the mask layout that represents a potential defect generation location. At this point, the process can go straight to a "LAYOUT REDESIGN" step to adjust those portions of the mask layout that are associated with the centerline intensity maxima/minima detected during step 530. Note that the layout redesign of step 550 will typically be performed outside of the layout verification system. For example, check positions identified by layout verification system 400 in FIG. 4A could be provided to a separate workstation using a separate layout design tool(s) for design modification.

As noted above with respect to FIGS. 4A and 4B, the centerline intensity peaks/valleys do not definitively indicate locations at which pinch or bridge defects will be generated. Notably, some check positions may turn out to produce exposure patterns that fall within the design specifications. Therefore, in an optional "TRANSVERSE WIDTH EVALUATION" step 540, the transverse width (i.e., the transverse width) of the exposure pattern feature (i.e., an exposure pattern element or a space between exposure pattern elements) associated with each check position is calculated (e.g., by TW determination logic 424 in FIG. 4B). Any check position having a transverse width that is greater than a defect threshold value is removed from the set of locations requiring redesign, thereby minimizing the amount of layout modification required (i.e., only those check positions exhibiting transverse widths less than the defect threshold value require layout redesign). Note that the transverse width determination of step 540 can be performed using the same type of lithography simulation used in conventional simulation-based verification. Because the modeling of step 540 is only performed for a small proportion of the layout (i.e., only at centerline intensity maxima/minima locations), the simulation can advantageously be performed in much less time than is required by conventional "whole layout" simulations.

Figure 1:
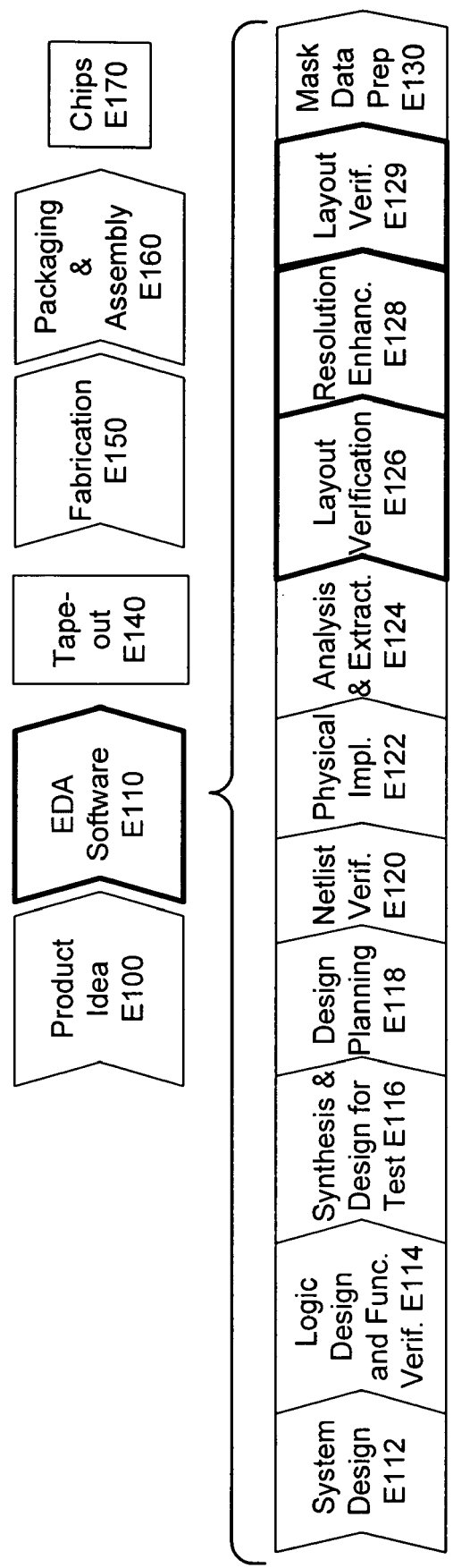
FIG. 1 is a simplified flow diagram of a standard EDA process flow.
Figure 2:
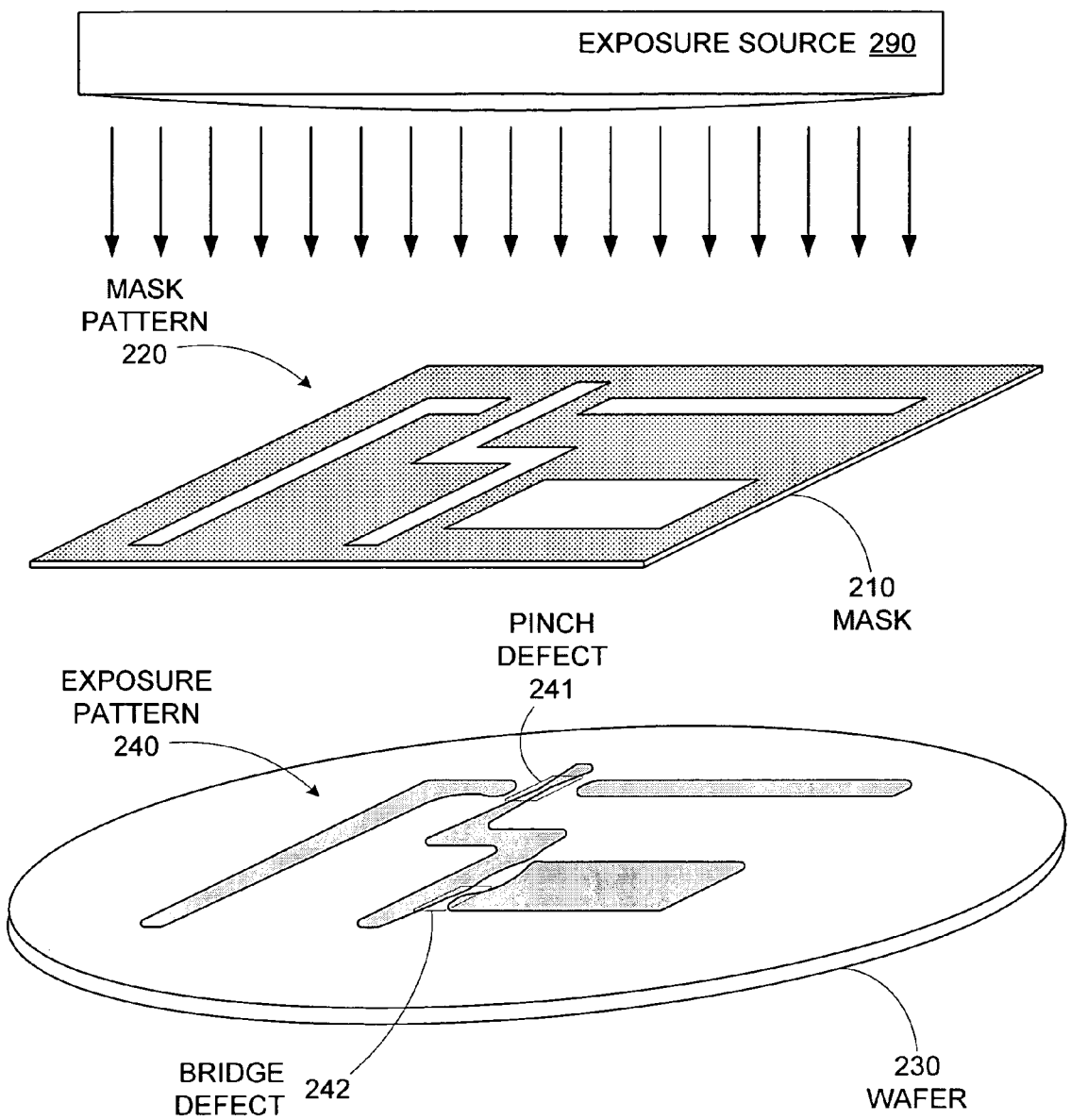
FIG. 2 is a diagram of a lithography operation.

Thus, by actually modeling the exposure pattern at the centerline intensity maxima/minima locations, a determination can be made as to which of those locations will probably exhibit pinch/bridge defects, and consequently, which of the associated locations in the mask layout may require redesign. Note that the centerline intensity-based layout verification described with respect to FIG. 5 can be performed at any stage in an IC design process. For example, in one embodiment, the verification can be performed immediately after layout extraction (e.g., after step E124 in FIG. 1). In another embodiment, centerline intensity-based layout verification can be performed after the incorporation of assist features or after the application of OPC (e.g., after step E128 in FIG. 1). Note further that the centerline intensity-based layout verification described with respect to FIG. 5 can be applied to any type of layout (e.g., to a phase shift mask (PSM) layout).

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for evaluating a mask layout, the method comprising:
    defining a centerline of a mask layout feature, the mask layout feature comprising one of a mask layout element and a space between adjacent mask layout elements;
    generating a simulated exposure intensity distribution by performing lithography simulation at the centerline;
    identifying an exposure pattern position of at least one of a local maximum and a local minimum for the simulated exposure intensity distribution;
    identifying a check position in the mask layout corresponding to the exposure pattern position, the check position representing a potential defect generation location in the mask layout and providing an output including the set of check positions,
    wherein for a mask layout feature including at least one of a corner and a line end, defining the centerline comprises trimming the centerline a predetermined distance from the at least one of the corner and the line end.

2. The method of claim 1, further comprising:
    performing lithography simulation at the check position to determine a transverse width of a simulated exposure pattern feature at the exposure pattern position, the simulated exposure pattern feature being associated with the mask layout feature; and
    comparing the transverse width to a defect threshold width to determine whether the exposure pattern position indicates a defect generation location.

3. A method for evaluating a mask layout, the method comprising:
    defining a first plurality of centerlines for a plurality of mask layout features in the mask layout, wherein each of the plurality of mask layout features comprises one of a mask layout element and a space between adjacent mask layout elements;
    generating a plurality of simulated exposure intensity distributions by performing lithography simulation at each of the first plurality of centerlines;
    identifying a set of exposure pattern positions for any local maxima and local minima of the plurality of simulated exposure intensity distributions;
    identifying a set of check positions in the mask layout corresponding to the set of exposure pattern positions, each of the set of check positions representing a potential defect generation location in the mask layout and providing an output including the set of check positions,
    wherein defining the first plurality of centerlines comprise:
    identifying a first set of centerlines in the first plurality of centerlines, each of the first set of centerlines extending to one of an end and a corner of a line element in the mask layout; and
    trimming each of the first set of centerlines away from one of the end and the corner of the line element by at least a predetermined distance.

4. The method of claim 3, further comprising:
    performing lithography simulation at each of the set of exposure pattern positions to generate a set of transverse widths, each of the transverse widths comprising a width of an exposure pattern feature associated with one of the set of exposure pattern positions; and
    comparing the set of transverse widths with a set of defect threshold values to determine which of the set of check positions correspond to actual defect generation locations.

5. The method of claim 3, wherein the first plurality of centerlines includes centerlines from all mask layout features in the mask layout.

6. The method of claim 3, wherein defining the first plurality of centerlines comprises filtering a set of centerlines for all mask layout features in the mask layout to eliminate centerlines of mask layout features that are unlikely to generate exposure features exhibiting defects.

7. The method of claim 6, wherein filtering comprises applying at least one of the following rules to the set of centerlines for all mask layout features:
    eliminating any centerlines for layout elements having widths that are greater than a threshold element width;
    eliminating any centerlines for spacings between layout elements having widths that are greater than a spacing threshold width;
    eliminating any centerlines for layout elements having minimum spacings from adjacent layout elements that are greater than an adjacent spacing threshold width; and
    eliminating centerlines any centerlines for short spacings between layout elements, each short spacing having a length that is less than a spacing threshold length.

8. A system for performing layout verification, the system comprising:
    logic for defining a first plurality of centerlines for a plurality of mask layout features in a mask layout, wherein each of the plurality of mask layout features comprises one of a mask layout element and a space between adjacent mask layout elements;
    logic for generating a plurality of simulated exposure intensity distributions by performing lithography simulation at each of the first plurality of centerlines;
    logic for identifying a set of exposure pattern positions for any local maxima and local minima of the plurality of simulated exposure intensity distributions;
    logic for identifying a set of check positions in the mask layout corresponding to the set of exposure pattern positions, each of the set of check positions representing a potential defect generation location in the mask layout and logic for providing an output including the set of check positions,
    wherein the logic for defining the first plurality of centerlines comprise:
    logic for identifying a first set of centerlines in the first plurality of centerlines, each of the first set of centerlines extending to one of an end and a corner of a line element in the mask layout; and logic for trimming each of the first set of centerlines away from one of the end and the corner of the line element by at least a predetermined distance.

9. The system of claim 8, further comprising:

logic for performing lithography simulation at each of the set of check positions to generate a set of transverse widths, each of the transverse widths comprising a width of an exposure pattern feature associated with one of the set of exposure pattern positions; and logic for comparing the set of transverse widths with a set of defect threshold values to determine which of the set of check positions correspond to actual defect generation locations.

10. The system of claim 8, wherein the first plurality of centerlines includes centerlines from all mask layout features in the mask layout.

11. The system of claim 8, wherein the logic for defining the first plurality of centerlines comprises filtering logic for filtering a set of centerlines for all mask layout features in the mask layout to eliminate centerlines of mask layout features that are unlikely to generate exposure features exhibiting defects.

12. The system of claim 11, wherein the filtering logic comprises logic for applying at least one of the following rules to the set of centerlines for all mask layout features:

eliminating any centerlines for layout elements having widths that are greater than a threshold element width;

eliminating any centerlines for spacings between layout elements having widths that are greater than a spacing threshold width;

eliminating any centerlines for layout elements having minimum spacings from adjacent layout elements that are greater than an adjacent spacing threshold width; and eliminating any centerlines for short spacings between layout elements, each short spacing having a length that is less than a spacing threshold length.

13. A computer-readable medium encoded with a program for controlling the operation of a computer, the program comprising:

instructions for causing the computer to define a first plurality of centerlines for a plurality of mask layout features in a mask layout, wherein each of the plurality of mask layout features comprises one of a mask layout element and a space between adjacent mask layout elements;

instructions for causing the computer to generate a plurality of simulated exposure intensity distributions by performing lithography simulation at each of the first plurality of centerlines;

instructions for causing the computer to identify a set of exposure pattern positions for any local maxima and local minima of the plurality of simulated exposure intensity distributions;

instructions for causing the computer to identify a set of check positions in the mask layout corresponding to the set of exposure pattern positions, each of the set of check positions representing a potential defect generation location in the mask layout and instructions for causing the computer to provide an output including the set of check positions, wherein instructions for causing the computer to define the first plurality of centerlines comprise:

instructions for causing the computer to identify a first set of centerlines in the first plurality of centerlines, each of the first set of centerlines extending to one of an end and a corner of a line element in the mask layout; and instructions for causing the computer to trim each of the first set of centerlines away from one of the end and the corner of the line element by at least a predetermined distance.

14. The computer-readable medium of claim 13, further comprising:

instructions for causing the computer to perform lithography simulation at each of the set of check positions to generate a set of transverse widths, each of the transverse widths comprising a width of an exposure pattern feature associated with one of the set of exposure pattern positions; and instructions for causing the computer to compare the set of transverse widths with a set of defect threshold values to determine which of the set of check positions correspond to actual defect generation locations.

15. The computer-readable medium of claim 13, wherein the first plurality of centerlines includes centerlines from all mask layout features in the mask layout.

16. The computer-readable medium of claim 13, wherein the instructions for causing the computer to define the first plurality of centerlines comprises instructions for causing the computer to filter a set of centerlines for all mask layout features in the mask layout to eliminate centerlines of mask layout features that are unlikely to generate exposure features exhibiting defects.

17. The computer-readable medium of claim 16, wherein the instructions for causing the computer to filter the set of centerlines for all mask layout features comprises instructions for causing the computer to apply at least one of the following rules to the set of centerlines for all mask layout features:

eliminating any centerlines for layout elements having widths that are greater than a threshold element width;

eliminating any centerlines for spacings between layout elements having widths that are greater than a spacing threshold width;

eliminating any centerlines for layout elements having minimum spacings from adjacent layout elements that are greater than an adjacent spacing threshold width; and eliminating any centerlines for short spacings between layout elements, each short spacing having a length that is less than a spacing threshold length.

* * * * *